(12) United States Patent
Kawabata (10) Patent No.: US 11,152,271 B2
(45) Date of Patent: Oct. 19, 2021

(54) SEMICONDUCTOR MODULE AND SEMICONDUCTOR DEVICE

(71) Applicant: Mitsubishi Electric Corporation, Tokyo (JP)

(72) Inventor: Satoshi Kawabata, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/908,378

(22) Filed: Jun. 22, 2020

(65) Prior Publication Data

US 2021/0183715 A1 Jun. 17, 2021

(30) Foreign Application Priority Data

Dec. 17, 2019 (JP) .............................. JP2019-227500

(51) Int. Cl.
*H01L 23/057* (2006.01)
*H01L 25/11* (2006.01)
*H01L 29/739* (2006.01)
*H01L 25/065* (2006.01)

(52) U.S. Cl.
CPC ........ *H01L 23/057* (2013.01); *H01L 25/0655* (2013.01); *H01L 25/115* (2013.01); *H01L 29/7393* (2013.01)

(58) Field of Classification Search
CPC ....... H01L 25/065–0657; H01L 25/105; H01L 25/115; H01L 23/057; H01L 29/7393
See application file for complete search history.

(56) References Cited

U.S. PATENT DOCUMENTS

| 5,629,559 A * | 5/1997 | Miyahara ............. H01L 23/057 257/666 |
| 2007/0215903 A1 | 9/2007 | Sakamoto et al. |
| 2013/0221516 A1 * | 8/2013 | Asada ............. H01L 23/49562 257/735 |

FOREIGN PATENT DOCUMENTS

JP 2007-281443 A 10/2007

* cited by examiner

*Primary Examiner* — Laura M Menz
*Assistant Examiner* — Candice Chan
(74) *Attorney, Agent, or Firm* — Studebaker & Brackett PC (57) ABSTRACT

According to one aspect of the present disclosure, a semiconductor module includes a semiconductor chip having a first electrode, a second electrode, and a control electrode to receive a control signal that controls a current flowing between the first electrode and the second electrode, a package having an upper surface, a back surface that is an opposite surface of the upper surface, and a plurality of side surfaces provided between the upper surface and the back surface, the package containing the semiconductor chip, a first terminal provided to the package and being electrically connected to the first electrode, a second terminal provided to the package and being electrically connected to the second electrode and a control terminal electrically connected to the control electrode and being provided on all of the plurality of side surfaces of the package so as to surround the package.

14 Claims, 6 Drawing Sheets

SEMICONDUCTOR MODULE AND
SEMICONDUCTOR DEVICE

BACKGROUND OF THE INVENTION

Field

The present disclosure relates to a semiconductor module and a semiconductor device.

Background

JP 2007-281443A discloses a power semiconductor device of a construction having a first electrode terminal and a second electrode terminal on the upper and lower surfaces, and a control electrode terminal which protrudes from a side surface between the first electrode terminal and the second electrode terminal.

In JP 2007-281443A, the control electrode terminal only protrudes from a part of the peripheral portion of the power semiconductor device. The directions in which signal wires can be drawn are thus limited. Therefore, depending on the arrangement of the driver for operating the power module, there may be a need to greatly draw around the signal wires.

SUMMARY

The present disclosure was made to resolve the problem mentioned above and has an object of obtaining a semiconductor module and a semiconductor device in which the signal wire can be simplified.

The features and advantages of the present disclosure may be summarized as follows.

According to one aspect of the present disclosure, a semiconductor module includes a semiconductor chip having a first electrode, a second electrode, and a control electrode to receive a control signal that controls a current flowing between the first electrode and the second electrode, a package having an upper surface, a back surface that is an opposite surface of the upper surface, and a plurality of side surfaces provided between the upper surface and the back surface, the package containing the semiconductor chip, a first terminal provided to the package and being electrically connected to the first electrode, a second terminal provided to the package and being electrically connected to the second electrode and a control terminal electrically connected to the control electrode and being provided on all of the plurality of side surfaces of the package so as to surround the package.

According to another aspect of the present disclosure, a semiconductor device includes a first semiconductor module and a second semiconductor module, wherein the first semiconductor module comprises a first semiconductor chip having a first electrode, a second electrode, and a first control electrode to receive a control signal that controls a current flowing between the first electrode and the second electrode, a first package having an upper surface, a back surface that is an opposite surface of the upper surface, and a side surface provided between the upper surface and the back surface, the first package containing the first semiconductor chip, a first terminal provided to the first package and being electrically connected to the first electrode a second terminal provided to the first package and being electrically connected to the second electrode; and a first control terminal electrically connected to the first control electrode and being provided on the side surface of the first package, wherein the second semiconductor module comprises a second semiconductor chip having a third electrode, a fourth electrode, and a second control electrode to receive a control signal that controls a current flowing between the third electrode and the fourth electrode, a second package having an upper surface, a back surface that is an opposite surface of the upper surface, and a side surface provided between the upper surface and the back surface, the second package containing the second semiconductor chip, a third terminal provided to the second package and being electrically connected to the third electrode, a fourth terminal provided to the second package and being electrically connected to the fourth electrode; and a second control terminal electrically connected to the second control electrode and being provided on the side surface of the second package, and wherein the first control terminal and the second control terminal are in contact with each other.

Other and further objects, features and advantages of the disclosure will appear more fully from the following description.

DESCRIPTION OF EMBODIMENTS

Semiconductor modules and semiconductor devices according to embodiments of the present disclosure will be described with reference to the accompanying drawings. Components identical or corresponding to each other are indicated by the same reference characters, and repeated description of them is avoided in some cases.

First Embodiment

Figure 1:
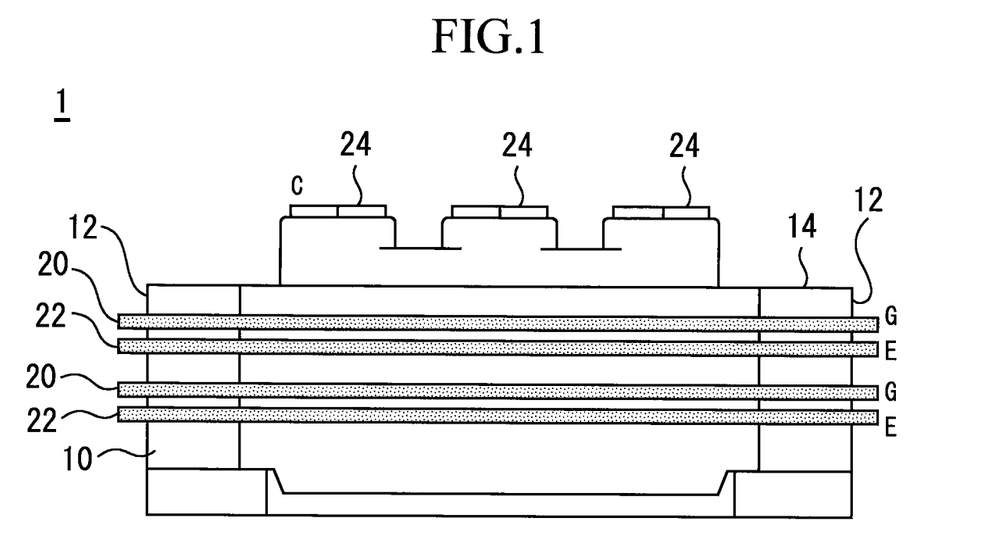
FIG. 1 is a front view of a semiconductor module according to a first embodiment.

FIG. 1 is a front view of a semiconductor module 1 according to a first embodiment. The semiconductor module 1 is, for example, a power module. The semiconductor module 1 includes a package 10. The package 10 is provided with first terminals 24, second terminals 22, and control terminals 20. The first terminals 24 are provided on an upper surface 14 of the package 10. The second terminals 22 and the control terminals 20 are provided on side surfaces 12 of the package 10.

Figure 2:
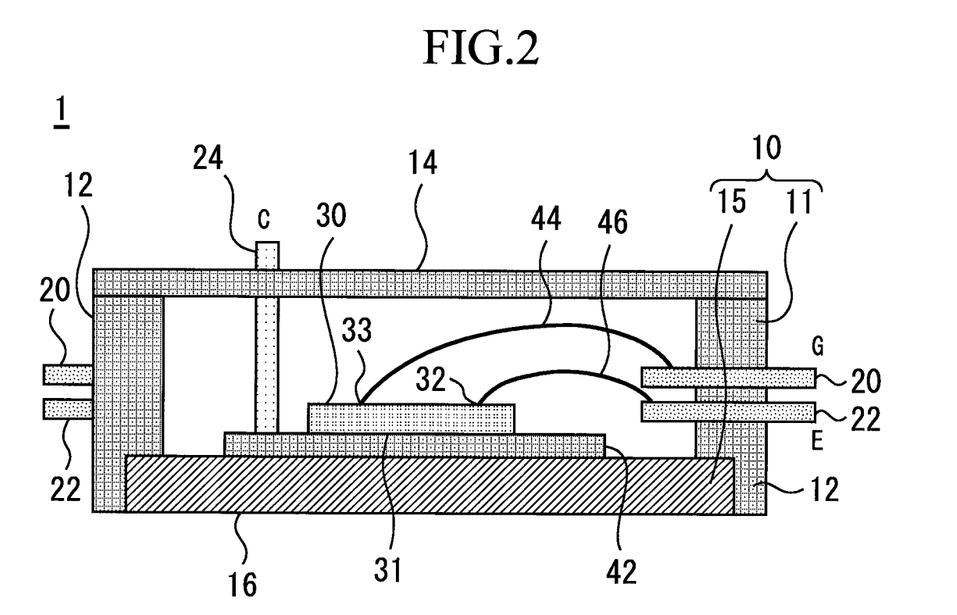
FIG. 2 is a cross-sectional view of the semiconductor module according to the first embodiment.

FIG. 2 is a cross-sectional view of the semiconductor module according to the first embodiment. It should be noted that in FIG. 2, some parts of the elements shown in FIG. 1 are omitted. The package 10 has a case 11 and a base plate 15. The package 10 has the upper surface 14 and a back surface 16 that is an opposite surface of the upper surface 14. The package 10 further has a plurality of side surfaces 12 provided between the upper surface 14 and the back surface 16. The upper surface 14 and the side surfaces 12 are part of the case 11. Further, the back surface 16 is a part of the base plate 15.

On the base plate 15 there is provided a circuit pattern 42. On the circuit pattern 42 there is provided a semiconductor chip 30. The semiconductor chip 30 is contained within the package 10.

The semiconductor chip 30 has a first electrode 31, a second electrode 32, and a control electrode 33. The control electrode 33 receives a control signal that controls a current flowing between the first electrode 31 and the second electrode 32. The semiconductor chip 30 is, for example, an IGBT (Insulated Gate Bipolar Transistor). If the semiconductor chip 30 is an IGBT, the first electrode 31 is a collector electrode, the second electrode 32 is an emitter electrode, and the control electrode 33 is a gate electrode.

A first terminal 24 is provided on the circuit pattern 42 and is exposed at the upper surface of the package 10. The first terminal 24 is electrically connected to the first electrode 31 of the semiconductor chip 30 via the circuit pattern 42. The first terminal 24 is, for example, the main electrode terminal of the semiconductor module 1. If the semiconductor chip 30 is an IGBT, the first terminal 24 is a collector terminal.

A second terminal 22 protrudes from the side surfaces 12 of the package 10. The portion of the second terminal 22 that is on the inside of the package 10 is connected to the second electrode 32 by a wire 46. The second terminal 22 is thus electrically connected to the second electrode 32. The second terminal 22 is an output terminal to be connected to, for example, a ground terminal or a load. If the semiconductor chip 30 is an IGBT, the second terminal 22 is an emitter terminal.

A control terminal 20 protrudes from the side surfaces 12 of the package 10. The portion of the control terminal 20 that is on the inside of the package 10 is connected to the control electrode 33 by a wire 44. The control terminal 20 is thus electrically connected to the control electrode 33. The control terminal 20 inputs a control signal for operating the semiconductor module 1. If the semiconductor chip 30 is an IGBT, the control terminal 20 is a gate terminal.

In FIG. 2, one each of a first terminal 24, second terminal 22, and control terminal 20 is provided to the package 10. In addition, the package 10 includes one semiconductor chip 30. This is not a limitation, however, and a plurality of first terminals 24, second terminals 22, and control terminals 20 may be provided to the package 10. In addition, the package 10 may contain a plurality of semiconductor chips 30.

Figure 3:
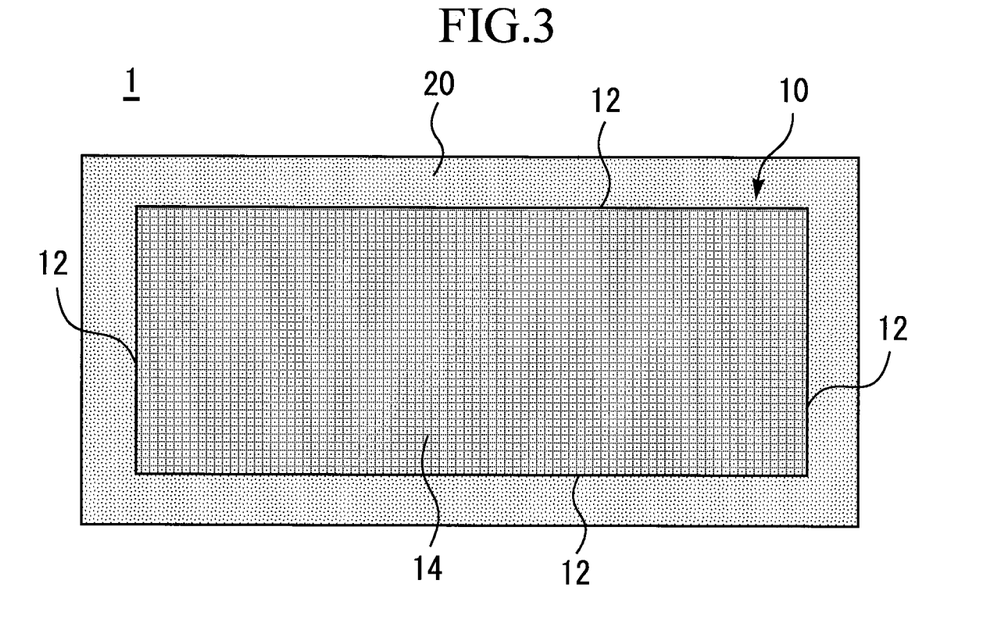
FIG. 3 is a plan view of the semiconductor module according to the first embodiment.

FIG. 3 is a plan view of the semiconductor module 1 according to the first embodiment. It should be noted that in FIG. 3, the first terminal 24 is omitted. The control terminal 20 is in the shape of a flat plate. The control terminal 20 is provided on all side surfaces 12 of the package 10 so as to surround the package 10. The package 10 according to the present embodiment has a rectangular shape in a plan view. The control terminal 20 is formed from one end to the other of each of the four side surfaces 12 of the package 10. The control terminal 20 is annular or flange like shaped.

As shown in FIGS. 1 and 2, the second terminal 22 is provided below the control terminal 20. The second terminal 22 is in the shape of a flat plate. The second terminal 22 is provided on all of the plurality of side surfaces 12 of the package 10 so as to surround the package 10. The second terminal 22 is of a shape similar to the control terminal 20, and they overlap each other as seen in a plan view.

As shown in FIG. 2, the control terminal 20 and the second terminal 22 protrude into the inside of the package 10 at part of the side surfaces 12 of the package 10. This is not a limitation, however, and the portion of the control terminal 20 that protrudes into the inside of the package 10 may be provided so as to surround the semiconductor chip 30. This allows for an increased degree of freedom of the wire that connect the semiconductor chip 30 and the control terminal 20. Likewise, the portion of the second terminal 22 that protrudes into the inside of the package 10 may be provided so as to surround the semiconductor chip 30.

Figure 4:
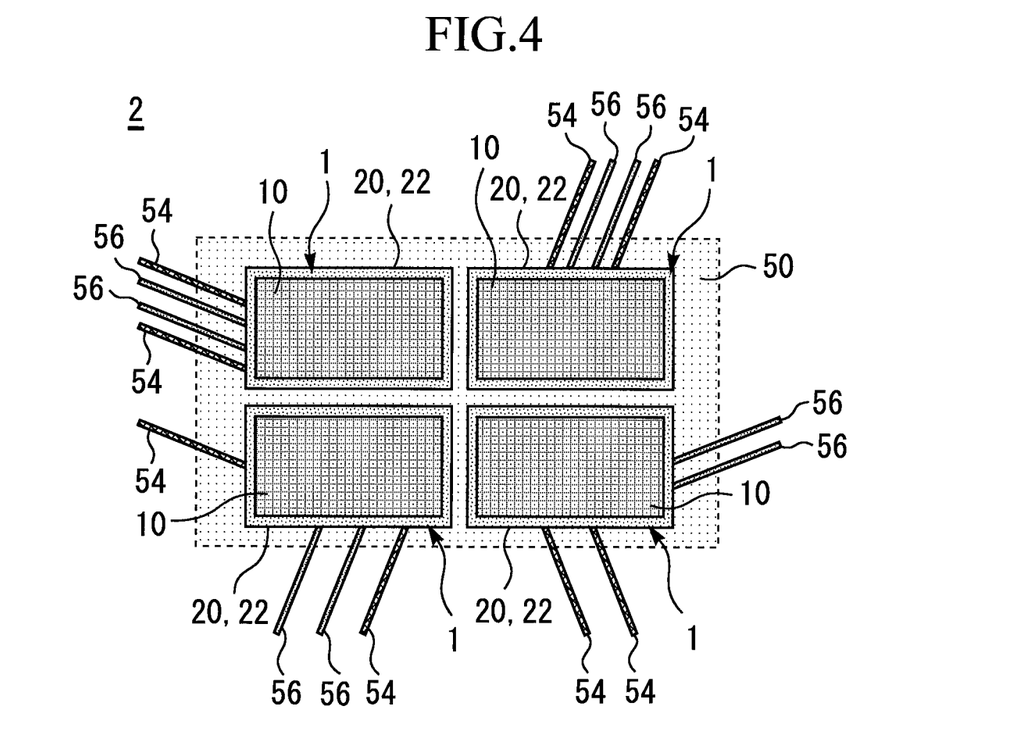
FIG. 4 is a plan view of a semiconductor device according to the first embodiment.

FIG. 4 is a plan view of a semiconductor device 2 according to the first embodiment. For the sake of convenience, in FIG. 4 the position of a busbar 50 above the semiconductor modules 1 is shown in dotted lines. The semiconductor device 2 includes a plurality of semiconductor modules 1 and the busbar 50. In the semiconductor device 2, the busbar 50 electrically connected to the first terminals 24 is provided above the packages 10.

In each semiconductor module 1, the control terminal 20 is electrically connected to signal wires 54. The control terminal 20 and the signal wires 54 are connected by solder or clips, etc. The signal wires 54 receive a control signal from an external driver. The control electrode 33 receives the control signal via the signal wires 54 and the control terminal 20. This controls the current flowing between the first electrode 31 and the second electrode 32. In addition, the second terminal 22 is electrically connected to wires 56. The second terminal 22 and the wires 56 are connected by solder or clips, etc. The signal wires 54 and the wires 56 are drawn in a lateral direction from the semiconductor module 1.

Figure 5:
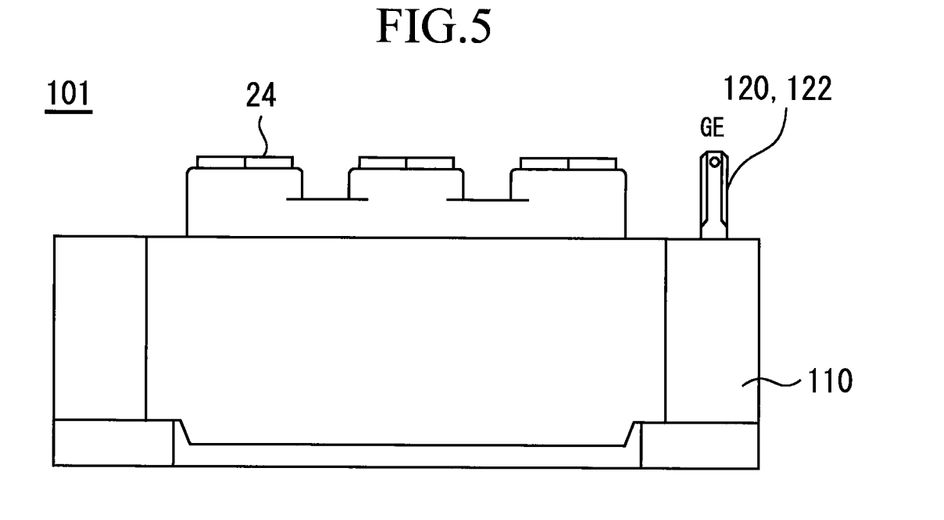
FIG. 5 is a front view of a semiconductor module according to a comparative example of the first embodiment.
Figure 6:
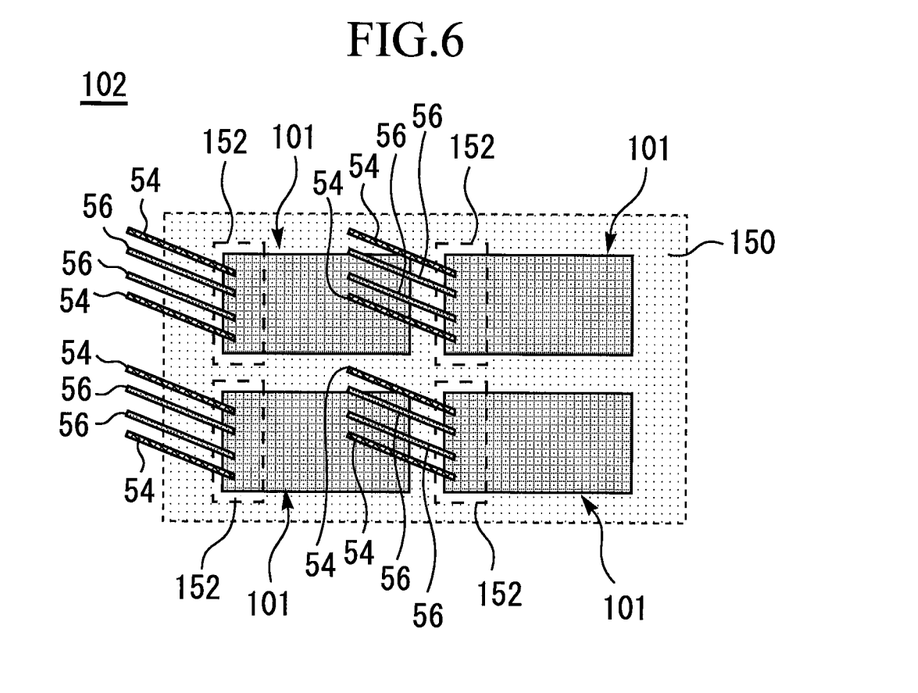
FIG. 6 is a plan view of a semiconductor device according to a comparative example of the first embodiment.
Figure 7:
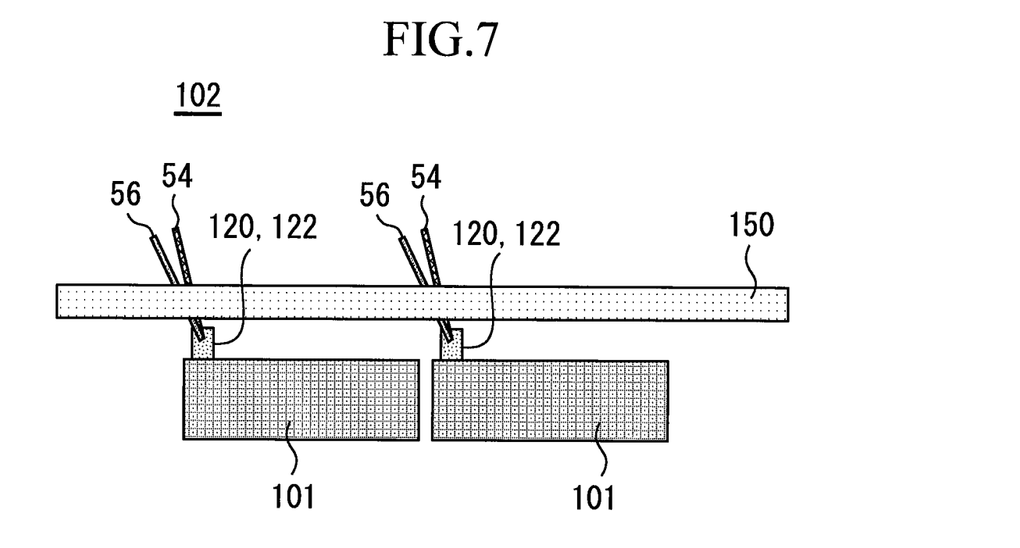
FIG. 7 is a front view of the semiconductor device according to a comparative example of the first embodiment.

FIG. 5 is a front view of a semiconductor module 101 according to a comparative example of the first embodiment. In the semiconductor module 101, the first terminal 24, a second terminal 122, and a control terminal 120 protrude from the upper surface of the package 10. FIG. 6 is a plan view of a semiconductor device 102 according to a comparative example of the first embodiment. FIG. 7 is a front view of the semiconductor device 102 according to a comparative example of the first embodiment. The semiconductor device 102 includes a plurality of semiconductor modules 101 and a busbar 150. For the sake of convenience, in FIG. 6 the position of the busbar 150 above the semiconductor modules 101 is shown in dotted lines.

When the control terminal 120 faces upward as in the semiconductor module 101, the signal wires 54 will be connected from above the semiconductor module 101. Therefore, in order to connect the control terminal 120 to an external driver, there is a need to form an opening 152 in the busbar 150. Accordingly, there is a need to process the busbar 150, which may lead to increased manufacturing costs of the semiconductor device 102.

In contrast, in the present embodiment, the control terminal 20 is arranged at the periphery of the semiconductor module 1. Therefore, the signal wires 54 can be drawn in a lateral direction from the semiconductor module 1. Accordingly, even if the semiconductor modules 1 are covered by the busbar 50, there is no need to form an opening in the busbar 50, which makes it possible to manufacture the semiconductor device 2 at a low cost.

Another conceivable comparative example of the present embodiment is one wherein the control terminal 120 is provided on only part of the plurality of side surfaces of the package 110. In this case, the direction in which the signal wires 54 can be drawn is limited, and it may be necessary to process the busbar 150 in order to connect the control terminal 120 to the driver. In addition, there may be a need to greatly draw around the signal wires 54.

In contrast, the control terminal 20 according to the present embodiment is provided on all side surfaces 12 so as to surround the package 10. Therefore, the signal wires 54 can be drawn from any position of the peripheral portion of the semiconductor module 1. In other words, it is possible to draw the signal wires 54 in all directions from the semiconductor module 1 in a plan view. Accordingly, there is no need to process the busbar 50. In addition, it is possible to avoid greatly drawing around the signal wires 54, and to simplify the signal wires 54. This makes it possible to prevent incorrect wiring. Further, by simplifying the signal wires 54, the semiconductor device 2 can be miniaturized.

Likewise, since the second terminal 22 is arranged at the periphery of the semiconductor module 1, the wires 56 can be drawn in a lateral direction from the semiconductor module 1. Further, since the second terminal 22 is provided so as to surround the package 10, the wires 56 can be drawn from any position of the peripheral portion of the semiconductor module 1. Accordingly, it is possible to avoid greatly drawing around the wires 56, and to simplify the wires 56.

As a variant of the present embodiment, the control terminals 20 and the second terminals 22 may have different configurations. For example, the second terminal 22 need only be provided on at least one of the plurality of side surfaces 12 of the package 10. Alternatively, the second terminal 22 may be provided on the upper surface 14 of the package 10. In addition, the semiconductor device 2 may include one or more semiconductor modules 1.

Further, the semiconductor chip 30 may be made with a wide-bandgap semiconductor. Wide-bandgap semiconductors include, for example, silicon carbide, a gallium nitride-based material or diamond. This makes it possible to miniaturize the semiconductor module 1, and accordingly to further miniaturize the semiconductor device 2.

These modifications can be appropriately applied to a semiconductor module and a semiconductor device according to embodiments below. Meanwhile, for the semiconductor module and the semiconductor device according to the embodiments below, dissimilarities with the first embodiment will mainly be explained as they have many similarities with the first embodiment.

Second Embodiment

Figure 8:
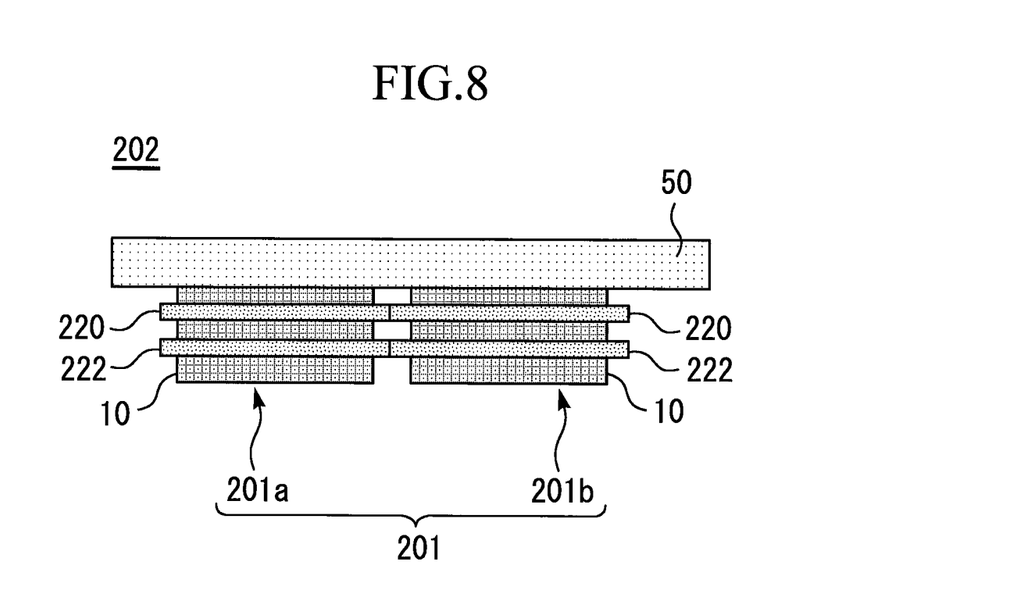
FIG. 8 is a front view of a semiconductor device according to a second embodiment.

FIG. 8 is a front view of a semiconductor device 202 according to a second embodiment. The semiconductor device 202 includes a plurality of semiconductor modules 201. The semiconductor module 201 differs from the semiconductor module 1 according to the first embodiment in terms of the structure of the control terminals 220 and the second terminals 222. Other structures are the same as in the first embodiment. A busbar 50 is provided above the plurality of semiconductor modules 201. The first terminals 24 of the plurality of semiconductor modules 201 are thus electrically connected to the busbar 50.

The semiconductor modules 201 include a first semiconductor module 201a and a second semiconductor module 201b, which are adjacent to each other. The first semiconductor module 201a and the second semiconductor module 201b have the same structure. The control terminal 220 of the first semiconductor module 201a and the control terminal 220 of the second semiconductor module 201b are in contact with each other. Further, the second terminal 222 of the first semiconductor module 201a and the second terminal 222 of the second semiconductor module 201b are in contact with each other.

Figure 9:
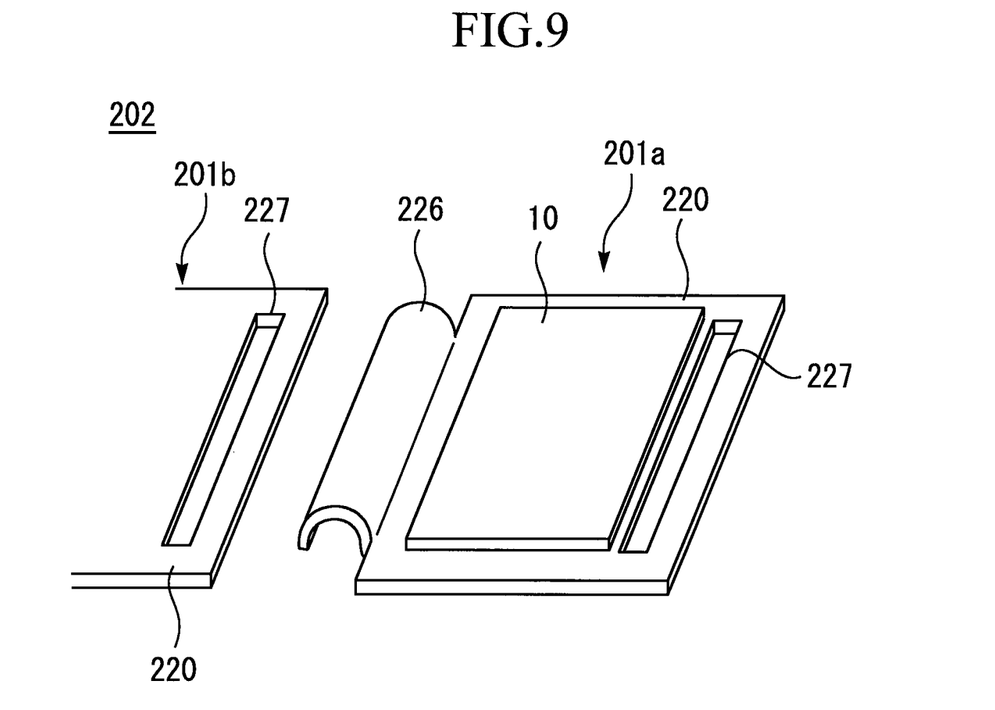
FIG. 9 is a perspective view of the semiconductor device according to the second embodiment.

FIG. 9 is a perspective view of the semiconductor device 202 according to the second embodiment. Each control terminal 220 has a hook portion 226 on one side of the package 10. In addition, an opening 227 is formed in each control terminal 220 on the other side of the package 10. The hook portion 226 of the first semiconductor module 201a is inserted into the opening 227 of the second semiconductor module 210b. The control terminal 220 of the first semiconductor module 201a and the control terminal 220 of the second semiconductor module 201b thus fit together.

In the same manner, the second terminal 222 of the first semiconductor module 201a and the second terminal 222 of the second semiconductor module 201b also fit together.

The structure of the control terminal 220 is not limited to the one shown in FIG. 9. The control terminal 220 needs only to fit together or be in contact with another adjacent control terminal 220. Likewise, the second terminal 222 needs only to fit together or be in contact with another adjacent second terminal 222.

Figure 10:
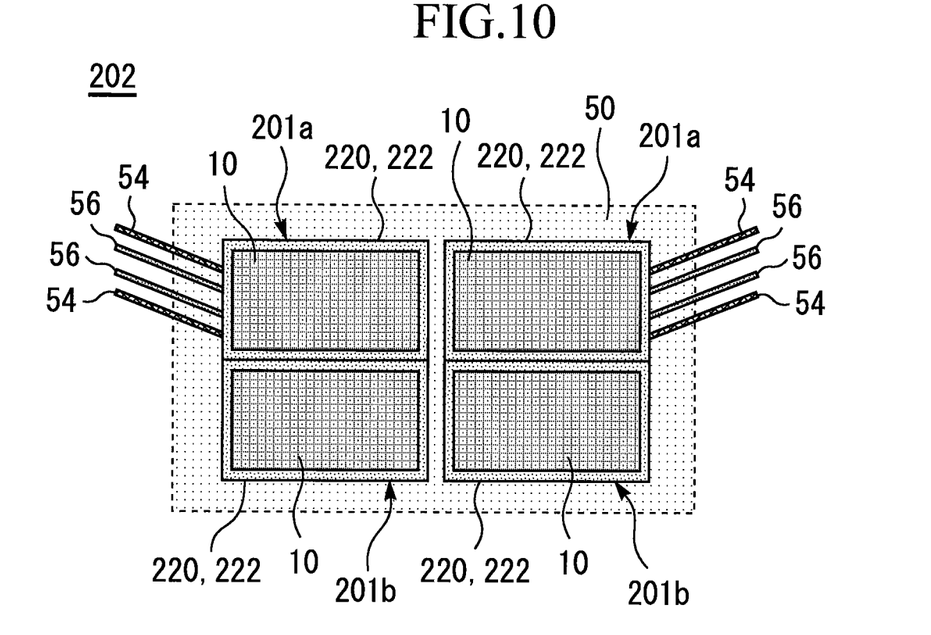
FIG. 10 is a plan view of the semiconductor device according to the second embodiment.

FIG. 10 is a plan view of the semiconductor device 202 according to the second embodiment. For the sake of convenience, in FIG. 10 the position of the busbar 50 above the semiconductor modules 201 is shown in dotted lines. In the semiconductor device 202, the signal wires 54 are drawn from only one of the control terminal 220 of the first semiconductor module 201a and the control terminal 220 of the second semiconductor module 201b that are in contact with each other. Likewise, the wires 56 are drawn from only one of the second terminal 222 of the first semiconductor module 201a and the second terminal 222 of the second semiconductor module 201b that are in contact with each other.

Figure 11:
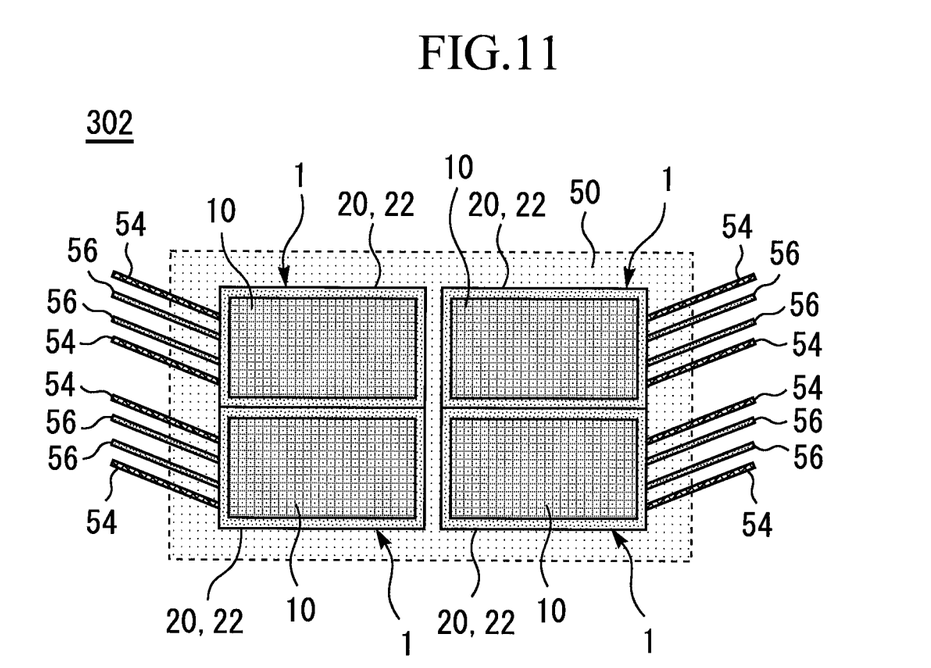
FIG. 11 is a plan view of a semiconductor device according to a comparative example of the second embodiment.

FIG. 11 is a plan view of a semiconductor device 302 according to a comparative example of the second embodiment. For the sake of convenience, in FIG. 11 the position of the busbar 50 above the semiconductor modules 1 is shown in dotted lines. In the semiconductor device 302, signal wires 54 and wires 56 are drawn from each of the plurality of semiconductor modules 1.

In contrast, in the present embodiment, the control terminal 220 of the first semiconductor module 201a and the control terminal 220 of the second semiconductor module 201b are in contact and electrically connected to each other. Therefore, when connecting a plurality of semiconductor modules 201 in parallel, there is no need to provide signal wires 54 for each semiconductor module 201. The signal wires 54 can therefore be simplified. Likewise, the second terminal 222 of the first semiconductor module 201a and the second terminal 222 of the second semiconductor module 201b are also in contact and electrically connected to each other. Therefore, there is no need to provide wires 56 for each semiconductor module 201 and the wires 56 can thus be simplified.

In the present embodiment, the simplification of the signal wires 54 and the wires 56 allows for miniaturization of the semiconductor device 202. In addition, by having the first semiconductor module 201a and the second semiconductor module 201b be in contact with each other, it is possible to further miniaturize the semiconductor device 202.

In addition, the control terminal 220 fits together with another control terminal 220 at its long side. This ensures a large contact area between the control terminals 220. Likewise, the second terminal 222 fits together with another second terminal 222 at its long side, which ensures a large contact area between the second terminals 222.

In FIG. 10, the control terminals 220 of two semiconductor modules 1 are in contact with each other. This is not a limitation, however, and the control terminals 220 of three or more semiconductor modules 201 may also be in contact with each other.

Further, the control terminal 220 is provided to the entire peripheral portion of the package 10, like the control terminal 20 according to the first embodiment. This is not a limitation, however, and the control terminal 220 may be provided on a part of the plurality of side surfaces 12 so long as it is capable of being in contact with another control terminal 220. For example, the control terminal 220 may be provided only on the long side of the package 10.

In addition, in at least one of the first semiconductor module 201a and the second semiconductor module 201b, the semiconductor chip 30 may be made with a wide-bandgap semiconductor. This can improve the heat resistance of the semiconductor chip 30, allowing for the first semiconductor module 201a and the second semiconductor module 201b to be positioned closer to each other.

Meanwhile, technical features explained in each embodiment may be appropriately combined to use.

In the semiconductor module according to the present disclosure, the control terminal is provided to surround the package. Accordingly, it is possible to avoid greatly drawing around the signal wire, and to simplify the signal wire.

In the semiconductor device according to the present disclosure, the first control terminal and the second control terminal are in contact with each other. Therefore, there is no need to provide a signal wire to each semiconductor module, which makes it possible to simplify the signal wire.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2019-227500, filed on Dec. 17, 2019 including specification, claims, drawings and summary, on which the Convention priority of the present application is based, are incorporated herein by reference in its entirety.

The invention claimed is:

1. A semiconductor module comprising:
   a semiconductor chip having a first electrode, a second electrode, and a control electrode to receive a control signal that controls a current flowing between the first electrode and the second electrode;
   a package having an upper surface, a back surface that is an opposite surface of the upper surface, and a plurality of side surfaces provided between the upper surface and the back surface, the package containing the semiconductor chip;
   a first terminal provided to the package and being electrically connected to the first electrode;
   a second terminal provided to the package and being electrically connected to the second electrode; and
   a control terminal electrically connected to the control electrode and being provided on all of the plurality of side surfaces of the package so as to surround the package.

2. The semiconductor module according to claim 1, wherein the control terminal is annular.

3. The semiconductor module according to claim 1, wherein the second terminal is provided on at least one of the plurality of side surfaces of the package.

4. The semiconductor module according to claim 3, wherein the second terminal is provided on all of the plurality of side surfaces of the package so as to surround the package.

5. The semiconductor module according to claim 3, wherein the control terminal and the second terminal overlap in a plan view.

6. The semiconductor module according to claim 1, wherein the first terminal is provided on the upper surface of the package.

7. The semiconductor module according to claim 6, wherein above the package there is provided a busbar that is electrically connected to the first terminal.

8. The semiconductor module according to claim 1, wherein the semiconductor chip is made with a wide-bandgap semiconductor.

9. The semiconductor module according to claim 8, wherein the wide-bandgap semiconductor is silicon carbide, a gallium nitride-based material or diamond.

10. A semiconductor device comprising:
    a first semiconductor module; and
    a second semiconductor module,
    wherein the first semiconductor module comprises:
    a first semiconductor chip having a first electrode, a second electrode, and a first control electrode to receive a control signal that controls a current flowing between the first electrode and the second electrode;
    a first package having an upper surface, a back surface that is an opposite surface of the upper surface, and a side surface provided between the upper surface and the back surface, the first package containing the first semiconductor chip;
    a first terminal provided to the first package and being electrically connected to the first electrode;
    a second terminal provided to the first package and being electrically connected to the second electrode; and
    a first control terminal electrically connected to the first control electrode and being provided on the side surface of the first package,
    wherein the second semiconductor module comprises:
    a second semiconductor chip having a third electrode, a fourth electrode, and a second control electrode to receive a control signal that controls a current flowing between the third electrode and the fourth electrode;
    a second package having an upper surface, a back surface that is an opposite surface of the upper surface, and a side surface provided between the upper surface and the back surface, the second package containing the second semiconductor chip;
    a third terminal provided to the second package and being electrically connected to the third electrode;
    a fourth terminal provided to the second package and being electrically connected to the fourth electrode; and
    a second control terminal electrically connected to the second control electrode and being provided on the side surface of the second package, and
    wherein the first control terminal and the second control terminal are in contact with each other.

11. The semiconductor device according to claim 10, wherein the first control terminal and the second control terminal fit together.

12. The semiconductor device according to claim 10, wherein a wire is drawn from only one of the first control terminal and the second control terminal.

13. The semiconductor device according to claim 10, wherein the first semiconductor chip or the second semiconductor chip is made with a wide-bandgap semiconductor.

14. The semiconductor device according to claim 13, wherein the wide-bandgap semiconductor is silicon carbide, a gallium nitride-based material or diamond.

* * * * *